US008613170B2

(12) United States Patent
De Nardis

(10) Patent No.: US 8,613,170 B2
(45) Date of Patent: *Dec. 24, 2013

(54) SOLAR ROOF TILE WITH SOLAR AND PHOTOVOLTAIC PRODUCTION OF HOT WATER AND ELECTRICAL ENERGY

(76) Inventor: Maurizio De Nardis, Ceccano (IT)

( * ) Notice: Subject to any disclaimer, the term of this patent is extended or adjusted under 35 U.S.C. 154(b) by 0 days.

This patent is subject to a terminal disclaimer.

(21) Appl. No.: 13/596,974

(22) Filed: Aug. 28, 2012

(65) Prior Publication Data

US 2013/0055663 A1 Mar. 7, 2013

Related U.S. Application Data

(63) Continuation of application No. 12/377,505, filed as application No. PCT/IT2007/000293 on Apr. 19, 2007, now Pat. No. 8,281,523.

(30) Foreign Application Priority Data

Aug. 16, 2006 (IT) .............................. FR2006A0023

(51) Int. Cl.
*E04D 13/18* (2006.01)
(52) U.S. Cl.
USPC ........................................................ 52/173.3
(58) Field of Classification Search
USPC ..................... 52/173.3; 136/244, 248, 246
See application file for complete search history.

(56) References Cited

U.S. PATENT DOCUMENTS

| 4,069,812 A | * | 1/1978 | O'Neill | 136/246 |
| 4,143,643 A | * | 3/1979 | Gerin et al. | 126/583 |
| 4,953,537 A | * | 9/1990 | Allegro | 126/622 |

FOREIGN PATENT DOCUMENTS

| DE | 28 50 844 A1 | 6/1980 |
| DE | 19803343 A1 | 8/1999 |
| FR | 2415178 A | 8/1979 |
| JP | 10281563 A | 10/1998 |
| JP | 11340495 A | 12/1999 |
| JP | 200356417 A | 12/2000 |
| JP | 2002139252 A | 5/2002 |
| JP | 2003303990 A | 10/2003 |
| JP | 2007-120072 | 5/2007 |
| WO | 2007/013115 A | 2/2007 |

OTHER PUBLICATIONS

PCT/IT2007/000293, International Preliminary Report on Patentability, and Written Opinion of the International Search Authority, issued Feb. 17, 2009.

* cited by examiner

*Primary Examiner* — Jessica Laux
(74) *Attorney, Agent, or Firm* — Roberts Mlotkowski Safran & Cole P.C.

(57) ABSTRACT

A system composed of a special Tile, to cover whole roof, thermally insulating, ventilated, with no environmental impact, producing solar and photovoltaic energy, adequate to make hot water and/or electrical energy. Two functions, thermal and photovoltaic, are designed to operate in synergy, or independently. The photovoltaic can help the thermal system, if covered surfaces are too small for heating needs of the building, or in non-ideal climates, sending part of electrical energy to electrical water heaters positioned in the boiler, to complement hot water production during low irradiation seasons. The resulting roof is optimal in any climate; in areas with snowfall snow will melt on tiles that anyway develop heat; in hot areas during summers very high temperatures occur, thus transforming heat in heat exchangers into cooling, obtaining air conditioning or cold water below the floor. It will be possible to obtain heated water for pools from excess of hot water in summer and in winter.

22 Claims, 7 Drawing Sheets

Elements n. 19-20

SOLAR ROOF TILE WITH SOLAR AND PHOTOVOLTAIC PRODUCTION OF HOT WATER AND ELECTRICAL ENERGY

CROSS-REFERENCE TO RELATED APPLICATIONS

The present Application is a continuation of a co-pending U.S. patent application Ser. No. 12/377,505, filed Feb. 13, 2009, which was a U.S. National phase of International Application No. PCT/IT2007/000293 filed on Apr. 19, 2007, which claims priority from Italian Application No. FR2006A000023 filed on Aug. 16, 2006. Each of these applications is hereby incorporated by reference in its entirety into the present Application.

TECHNICAL FIELD

Object of the following patent is a "system composed of a special Tile, its variants and accessories, adequate to cover the whole roof, thermally insulating, ventilated, with no environmental impact, producing solar and photovoltaic energy, adequate for the production of hot water and/or electrical energy".

This system is applied in covering totally or partially roofs and walls, with modular, bi-component elements or pre-assembled ones, thermally insulating and ventilated, aimed at producing hot water and/or electrical energy.

The two elements that compose a "Tile" are described in detail in the following pages. They contain inside pipelines, mixing circuits, absorbing plates, and outside on the top side photovoltaic absorbers to produce electrical energy, such as:

a—embossed metal plates, treated externally with screens and various filters;

b—plastic materials made of carbon polymers or similar plastics c—embossed and/or die-cast silica derivatives These materials, when suitably produced, with coatings and special colored films, look like traditional tiles in their external (superior) side.

The "Tile" with its variants and accessories is specifically suited to cover the whole roof and/or walls of a house, industrial complex or any building that may be used to take advantage of solar energy, as expressed in the main claim; has no environmental impact and can thus be used in historic centers since it can faithfully replicate shapes and colors of traditional roof coverings, is adequate for any type of covering since it can be cut and shaped; has a low total cost and very high energetic yield.

BACKGROUND OF THE INVENTION

Presently, electrical energy and hot water production from systems positioned on buildings is obtained from photovoltaic and solar panels of various types and shapes.

Traditional photovoltaic panels are made of elements of various sizes, mainly composed of silica tiles connected to form a photovoltaic cell, meant to produce electrical energy. They are protected by ultraviolet-resistant glass or plastic screens, positioned above the cover or substituting the cover, for great surfaces. They absorb solar and ultraviolet rays, transforming them in electrical energy. They are not well integrated in the architecture of the building, except in extremely modern buildings where whole sections of the roof or adequately exposed walls are used.

Solar panels instead, used to collect solar radiant energy to produce hot water, are made of a solar collector which is simply a plate that collects solar radiation. A circuit is connected to the plate. The circuit allows the circulation of a fluid meant to remove thermal energy from the plate and to bring it to the internal network in order to be used. The inner components of the system are protected by an external transparent screen, like the one of photovoltaic panels, and by a thermally insulating screen positioned below, meant to avoid heat dispersion.

Solar panels have the same problems of photovoltaic panels; since they are positioned above the roof cover, or substituting it in the case of large surfaces, they do not integrate at all in the architecture of the building, thus creating a significant environmental contrast with the surrounding environment. Installation of these elements on roof covers is quite complex and often causes rain water leakage in time, both systems are too expensive in relation to the real energetic yield they produce. Several years are needed to counterbalance the installation cost; this factor significantly limits their use even today.

In the last years several inventors have dedicated themselves to finding alternative solutions to traditional solar and photovoltaic panels. Several patent applications have been requested and granted, both in Italy and abroad, for various types of products (covering tiles, tiles, etc.) with the objective of optimizing either the production of hot water, or of electricity, independently, with absorbing elements meant to cover buildings totally or partially, substituting solar and photovoltaic panels on the market today. These approaches forgot to consider that, in order to achieve a valid result, the "coverage system" needed to be improved mostly, using a system that could substitute the commonly used tiles, easily adjustable to any situation, avoiding environmental impact problems, able to produce hot water and electric energy through solar rays collection.

These new proposed or patented systems have not achieved any significant result, since they have not been accepted and produced by the industry, which still today produces traditional solar and photovoltaic panels. They also do not satisfy practical and functional requirements, in relation to adjustability to various roofs, cost lowering, performance and most of all compatibility with traditional roof coverings; in order not to create any environmental impact and be able to use them in traditional architecture and historic centers.

SUMMARY OF THE INVENTION

Currently, optimal and well implemented coverage of a house or more in general, of a building, is achieved through positioning thermally insulated and ventilated panels, positioned horizontally on the inclined top of an attic or traditional wooden top, on top of which terracotta roofing tiles, cement, slate, canadian tiles, other types of tiles, etc. are positioned. These coverings are made perfectly compatible with the surrounding environment by choosing the right type of tile depending on the location and thus satisfy the aesthetic and waterproofing requirements. They do not use, but simply dissipate the solar energy that they accumulate.

The new covering system proposed uses specifically-made Tiles to cover the entire building, becoming part of it, producing at the same time hot water for house use, for heating, and electrical energy, through collection and absorption of solar and ultraviolet radiation.

The new patent fully addresses the following requirements:

1. Insulates thermally the house's roof, providing optimal temperature. The problem of overheating of the highest floors caused by lack of adequate insulation and ventilation is common also with traditional systems 2. Creates an adequate ventilation between the insulating material and the roof structure below, both for wooden roofs, as in anglosaxon buildings of northern Europe, north America etc., or in reinforced concrete, as in traditional Italian buildings 3. Perfectly suits the architectural project, since the external surface reproduces the same shapes and colors of the various traditional tiles, thus allowing to use the new coverings also in historic centers and religious buildings.

4. May be used both on pitched roofs or on walls facing north, where there is no adequate solar irradiation, and on well-irradiated walls facing south, south west and south east 5. May be easily shaped, since not all roofs are linear and rectangular, to match corners, dormer windows, differences in roof height, etc. To be adjusted to this type of situation, it can be cut with a hacksaw and shaped depending on the technical needs, without wastes of time 6. It is a covering element with optimal, non-bulky size, adequate to meet technical and positioning requirements described previously. It satisfies insulation and plain covering requirements for walls facing north, while for irradiated parts it is a solar energy absorber, in order to produce both hot water and electrical energy, also separately, depending on needs. It resists weathering in time, it is easy to attach to the lower structure with a plug or nail, it is easy to be substituted or renewed on the external walk-on surface, exposed to weathering, every element is attached to the next vertically, thanks to male/female metal or plastic joints with adequate gaskets, while sideways they are overlapping.

DETAILED DESCRIPTION

An innovative coverage system, meant not only to cover buildings, but also to produce thermal and photovoltaic energy, to be introduced in the international market as a substitute for the existing products used to cover roofs and walls, has to satisfy simultaneously the following requirements:

The elements used have to cover the whole surface of the roof and, if applicable, also well-exposed walls, they have to suit well the architectural design, they have to be adequate to thermally insulate the roof, they have to suit the environment, they have to use the irradiated surfaces optimally and continuously, turning the covering into a single heat absorbing element for the production of hot water (eliminating the boiler) and for the production of electrical photovoltaic energy, significantly lowering the energetic expense for the building. If the covering is installed in the building phase, the cost lowering is maximal. A fundamental issue which should be considered is that only a part of the roof cover is positioned facing south, southwest or southeast, and can be optimally used to absorb solar energy, while all the remaining surface facing north can be used only for a partial absorption of ultraviolet rays.

The invention described in this patent introduces improvements and radical changes in the implementation of roof coverings of houses and buildings which can be summarized as follows: System suited to any type of building, both italian and anglosaxon, with reinforced cement or wooden roofs, total modularity, low cost with respect to the total energetic yield, ease of transport and of installation, zero aesthetic and environmental impact, lowering of electrical and thermal energy production cost with respect to alternative systems to the ones used, lowering of the photovoltaic cost in relation to the huge surface used, with financial aids from the government, in relation to the initial investment or other incentives active in other countries. The fundamental idea in the main claim of this patent is to obtain all the functions of a perfectly insulated and ventilated roof cover, together with the energetic yield coming from the total roof surface or a large part of it, aimed at exploiting simultaneously or separately photovoltaic and thermal solar energy.

The system uses a single element, a newly designed "Tile", whose size and shape can vary depending on needs, which can be produced both as a single, pre-assembled element, and in two separate parts, the top defined "covering tile" and the bottom defined "base", to be assembled during installation. The "Tile", of varying size depending on the models and types it replicates, exists in two types, "A", and "B", which are identical externally in both components, but differ in the inside contents.

Figure 1:
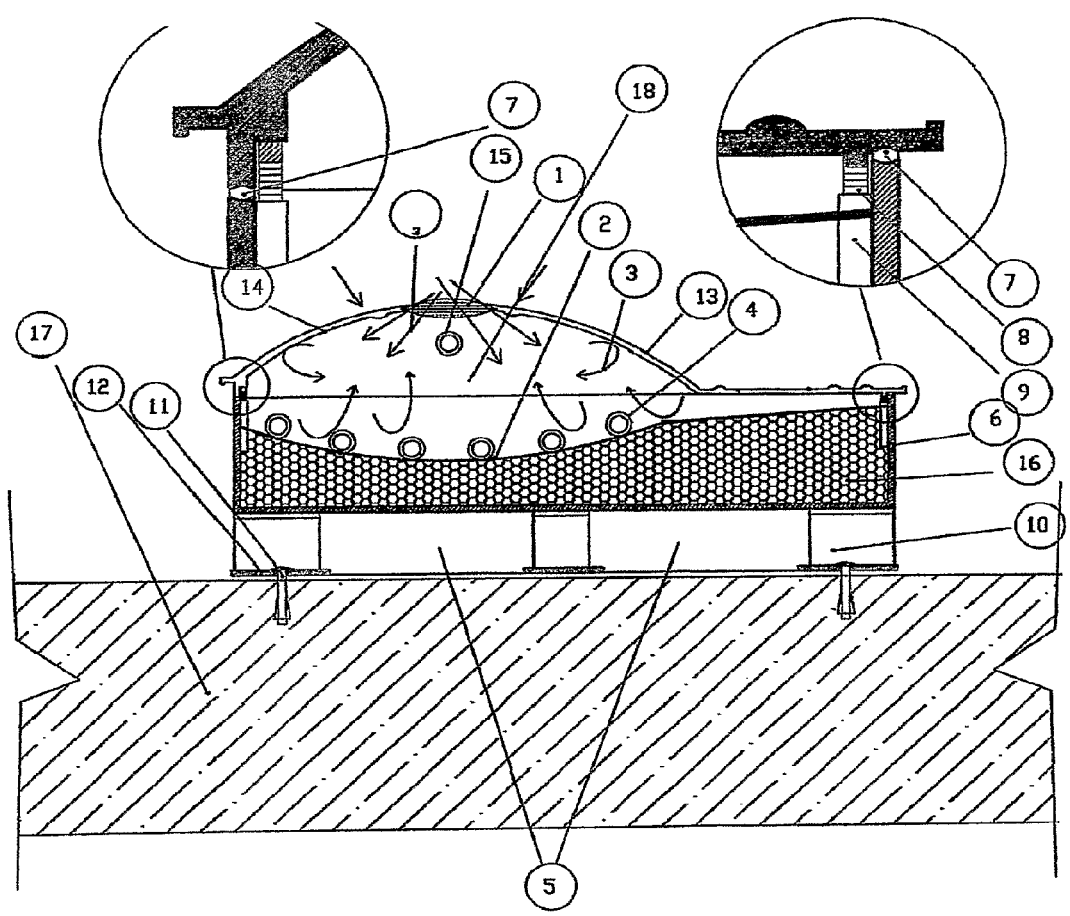
FIG. 1—Cross section of a type "A" "Tile" to produce thermal and/or electrical energy, with construction details, appearing externally as a traditional, portuguese type tile, of which the top tile, the base, the bifocal lens and the internal "boiler" with plate and absorbing pipes are evident.
Figure 2:
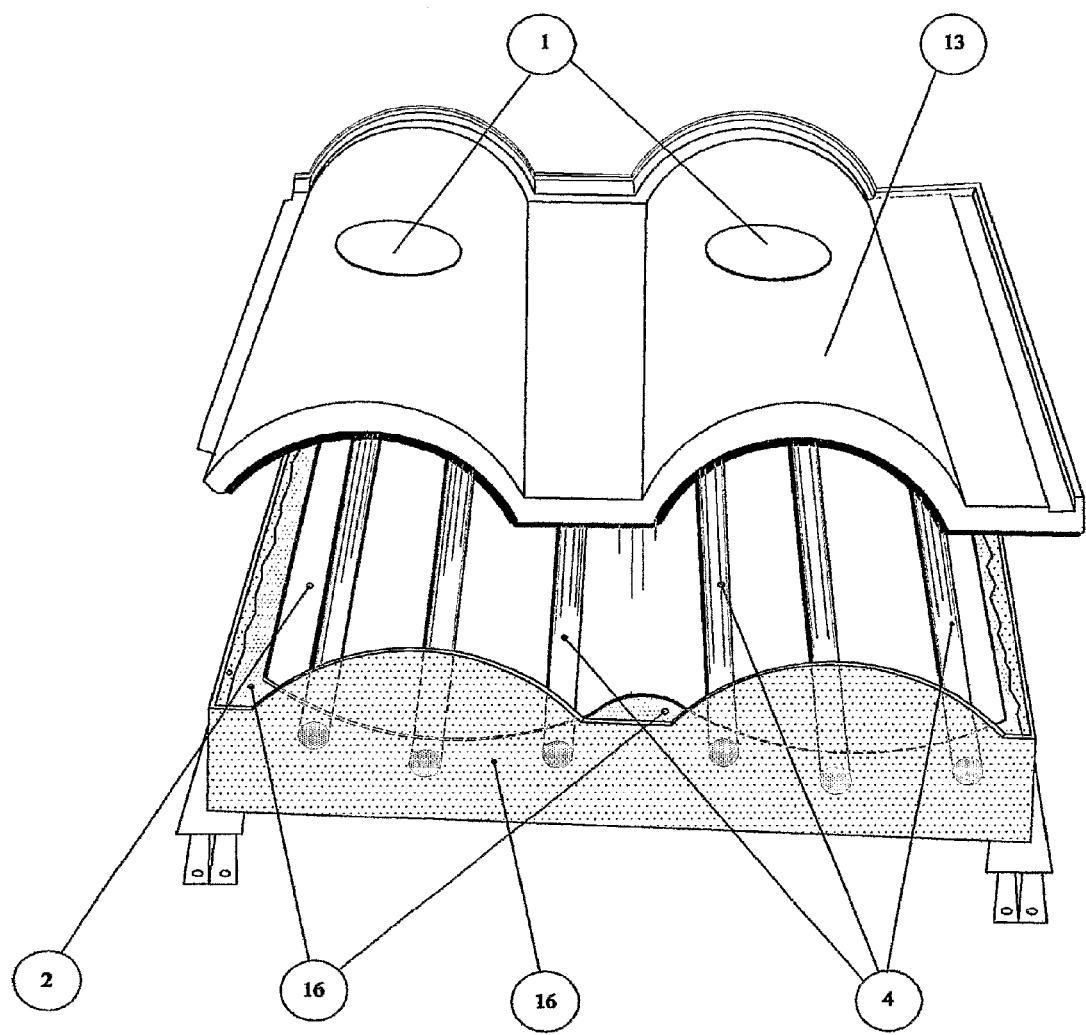
FIG. 2—Axionometry view of a type "A" "Tile" to produce thermal and/or electrical energy, with two covering tiles and the base normally positioned. The top tile has bifocal lenses. It is positioned backwards (not in the closed position) in order to show the inside of the tile with the plate, the absorbing pipes and the lower thermally insulating foam.
Figure 3:
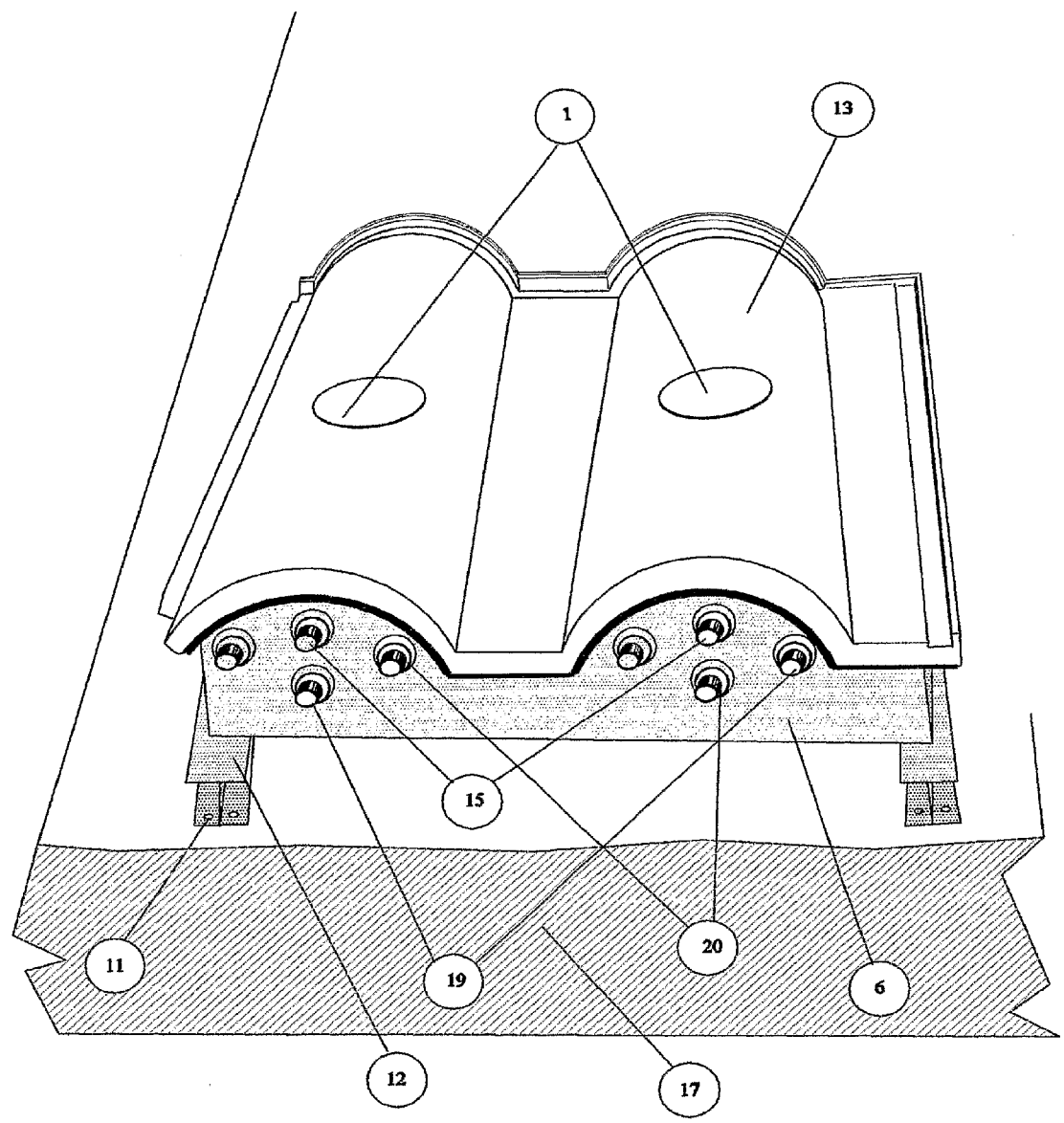
FIG. 3—Axionometry view towards the lower part of a type "A" tile to produce thermal and/or electrical energy, with two covering tiles, lenses type Fresnel, male joints, positioning braces and air chamber.

Type "A" (FIG. 1-2-3) is used in the adequately irradiated roof fractions, producing:

a—thermal energy through solar irradiation ((FIG. 1 n. 3) of the inside of the Tile, collected optimally from the custom-built top side and enhanced through the use lens type Fresnel to concentrate the rays solariums to the inside (FIG. 1 n. 1) positioned in the convex part (FIG. 1 n. 13) of the same tile, in order to capture sun rays from any angle, distribute and enhance them (FIG. 1 n. 3) inside the cavity of the tile (FIG. 1 n. 18), irradiating the metal plate and/or the radiation collecting pipes (FIG. 1 n. 2-4)

Figure 5:
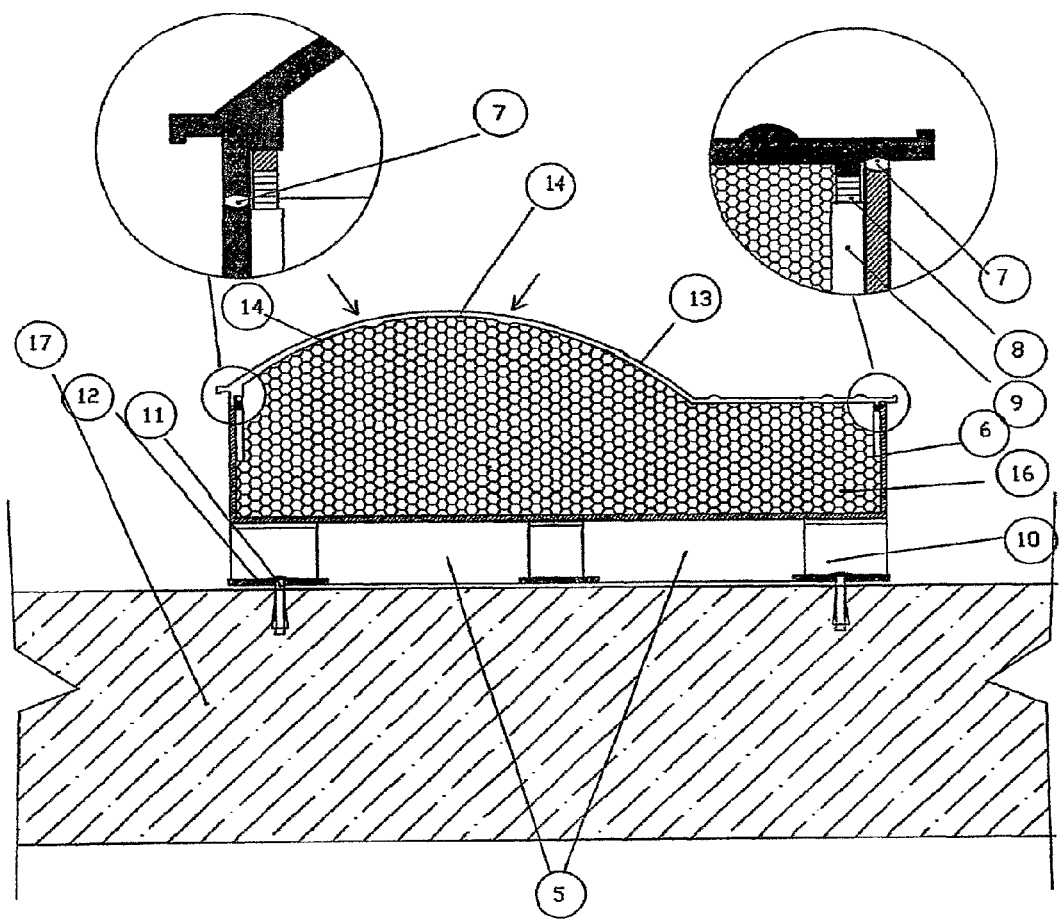
FIG. 5—Cross section of a type "B" "Simple tile" appearing externally as a traditional portuguese type tile, with top tile, base, insulating foam, fixing braces, positioning braces, air chamber FIG. 6—Cross section of a male/female joint connected to the pipes, which allows the perfect and simple fixing of a lower and an upper tile.
Figure 6:
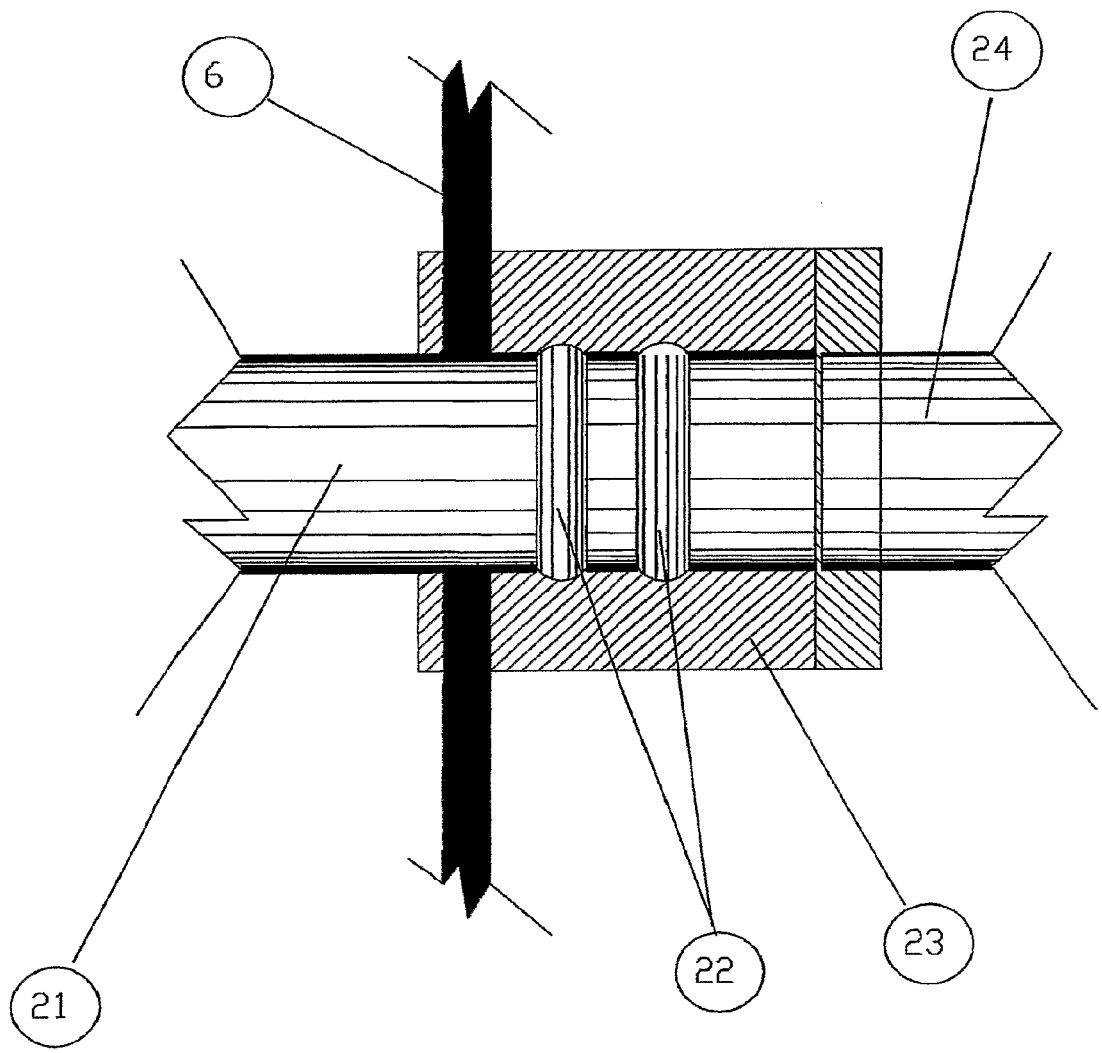

The use of the lens type Fresnel is optimal with metallic Tile, when the sun slant or the general situation is not satisfactory, it allows to position the tiles with any tilting and thus to apply them directly on any surface, disregarding the sunlight slant as with solar panels. When the sun rays hit the concave, collecting metal plate (FIGS. 1 and 2) inside the cavity, a series of reflections enhance the irradiating effect. Just like in a pool table, the rays bounce (FIG. 1 n. 3) and hit all internal surfaces (FIG. 1 n. 14) and their absorbing pipes (FIG. 1 n. 4), including the main one (FIG. 1 n. 15) positioned at the center of the convex part of the top tile. The inner surface of the top tile (FIG. 1 n. 13) is specifically treated in the case of tiles where plastic materials are used which are transparent on the external side and opaque and reflecting on the inside, so that solar and ultraviolet radiation is allowed in but not out, creating a greenhouse effect which increases the heat provided to the collector. The collecting plate (FIG. 1 n. 2) is positioned on insulating foam (FIG. 1 n. 16), with concave shape inside, inserted in the base element (FIG. 1 n. 6), the collecting pipes (FIG. 1. n. 4) are positioned on the plate (FIG. 1 n. 2), their number is suited to the specific use. For specific applications a double layer, embossed absorbing plate, with adequate canals acting as pipes; can be produced. All pipes inside every tile (FIG. 6 n. 21-24) are connected with the corresponding ones of the previous and subsequent one through male/female joints (FIG. 6 n. 23) with adequate sealing gaskets (FIG. 5 n. 7), in plastic or metal, suited to create a single circuit that connects all the tiles together to a heat exchanger for the production of hot water; the joining system allows a quick connection between the tiles without time consuming screwing, welding, etc.

b—electrical energy from photovoltaic energy through sun and ultraviolet rays absorption on behalf of the top of the tile (FIG. 1 n. 13-14). These tile elements (FIG. 1-2-3), connected to each other with specific joints (FIG. 1 n. 8) in plastic or metal as described later, turn the entire roof cover into a single photovoltaic panel.

Type "B", defined "simple tile", is meant as a jolly (FIG. 4), adjustable to any roof shape, to be used in those parts facing north that do not produce thermal energy and/or in difficult spots, where it is not necessary to use the energy producing tile. This element is composed of the "top tile" (FIG. 4-5 n. 13-14-5) without lens type Fresnel, and of the same lower "base" (FIG. 4-5 n. 6), either pre-assembled, or assembled later, foamed inside (FIG. 4-5 n. 16), and forming a single tile which can be cut, shaped etc., adjusting it to any covering need.

Figure 4:
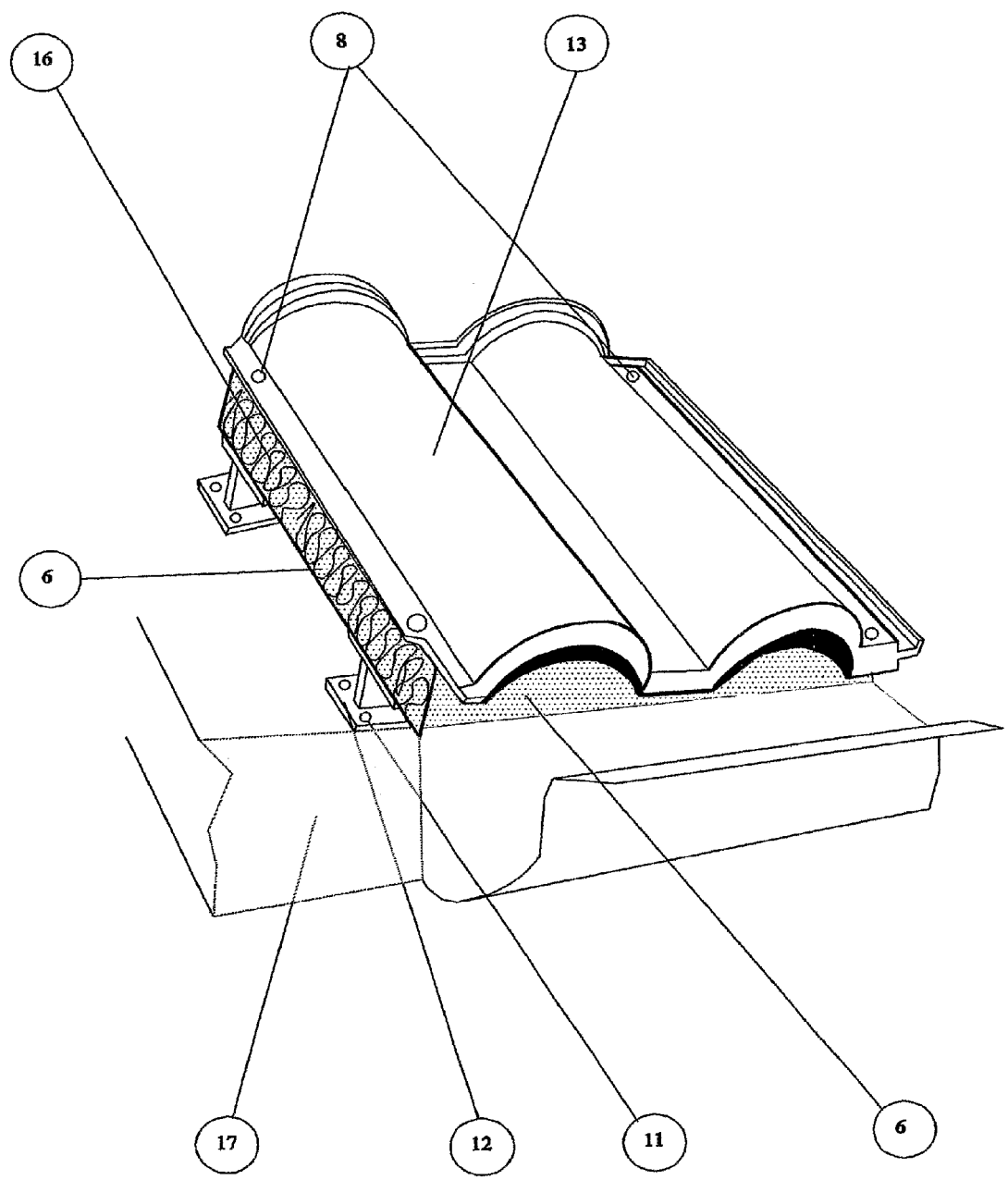
FIG. 4—Axionometry view of a type "B" "Simple tile" with two covering tiles, without bifocal lenses, with thermally insulating foam, positioning braces, air chamber, upper fixing points, base, and position of the first tile on the gutter pipe.

The "base" is made of a thermic hardened plastic or metal, forming a sort of a box without a lid, where the lid is the top tile. The base has containing side walls a few centimeters high (FIG. 1-2-3-4-5 n. 6), inside which the thermally insulating, type polyurethane or polystyrene-like material is foamed (FIG. 1-2-3-4-5 n. 16). The foam takes the specific concave shape on the top, onto which the absorbing layer is positioned. In the case of the simple tile, the foam fills the whole cavity, increasing the protection and thermal insulation of the less irradiated parts (FIG. 4 n. 16). The base forms an adequate air and ventilation chamber (FIG. 1-3-5 n. 5) between the lower stand and the tile, being raised from the stand a few centimeters through guides or positioning stands (FIG. 1-3-4-5 n. 10-12) also used to attach the tile unit with plugs or nails (FIG. 1-3-4-5 n. 11) to the lower structure (FIG. 1-3-4-5 n. 17), to avoid damage of the cover due to strong winds. For special needs, the base support can be made in rigid polyurethane or similar products, without using the external structure of the base support. It includes the space and adequate shape to fit in the absorbing plate, if appropriate with pipes contained in the polyurethane and guides and supports being part of the same unit.

The air chamber and the foaming avoid energy dispersion and condensation outside. The absorbing, concave galvanized metal, reflecting plate lies on the thermally insulating foaming. On top of it, some absorbing pipes are positioned, inside which runs a cheap liquid of high calorific value, like nitrogen mixtures and liquid phosphorus.

An additional central absorbing pipe (FIG. 1-3-5—n. 15) is positioned at the center of the concave cavity of the base, and of the convex cavity of the "upper tile". It lies on specific lodgings positioned at the two ends of the base (FIG. 1-5 n. 8). All the pipes of the thermal support have at the vertical ends of the base male/female joints (FIG. 1-6 n. 19-20) to connect to the adjacent tile. The base also has side guides (FIG. 1-5 n. 9) to match the fixing points from the upper tile (FIG. 1-5 n. 8).

The "covering tile" is made in any transparent plastic material or in carbon polymers coated with silicon films or conducting electrodes with micro/nano structural organic paint (one or more layers), adequately protected and resistant to ultraviolet rays, of an adequate color to match the color that the top tile will have according to architectural needs. If it is made with a heat conducting and absorbing metal layer (copper, alumina, etc.), it will be "doped" by coating it with suspended films of amorphous silica (double or triple joint) in the desired color, made porous through electrolytic attack, in order to exploit a wider band of the solar spectrum, or with other layered films suggested by the latest technical achievements, like silica films or other, adequate to collect photovoltaic energy from solar and ultraviolet rays. In this case too, the color of the external stand (FIG. 1-3-5 n. 13) will be what is suggested by the architectural needs. This top tile, thick enough to be able to be walked on, depending on size and material, is made with the external shape of the traditional tile one wants to reproduce, or with a novel design, and has joints to allow overlaps, shaping, etc. It has adequate gaskets (FIG. 1-5 n. 7) to make is water-tight, avoid condensation and leaks of vapour produced inside. It also has specific threaded plugs on the sides (FIG. 1-5 n. 8) to attach it by pushing it into the side guides of the lower support (FIG. 1-5 n. 9), making it a single and continuous unit with the other tiles.

The top tile hosts in its top, central convex part, as shown previously, a lens (FIG. 1-2-3 n. 1) which allows to attract sun rays (FIG. 1-5 n. 3) from any angle, distributing and enhancing them inside the tile. These rays are reflected by the Fresnel lens inside the oval cavity between the two parts of the tile, at the center of which runs the main pipe of the absorbing liquid. Solar rays enter the cavity, which is a real boiler, are reflected on the minor metal plate below on the main (FIG. 1-5 n. 15) and side (FIG. 1-2-3 n. 4) pipes, heating the liquid to high caloric temperatures. The inner concave side of the top tile is treated in order to make it opaque and reflecting on the inside. For polycarbonates or another plastic and vitreous materials, reflecting paints will be used not to allow rays to escape; for metal supports, they will be galvanized inside so that they reflect the rays inside the cavity.

Figure 7:
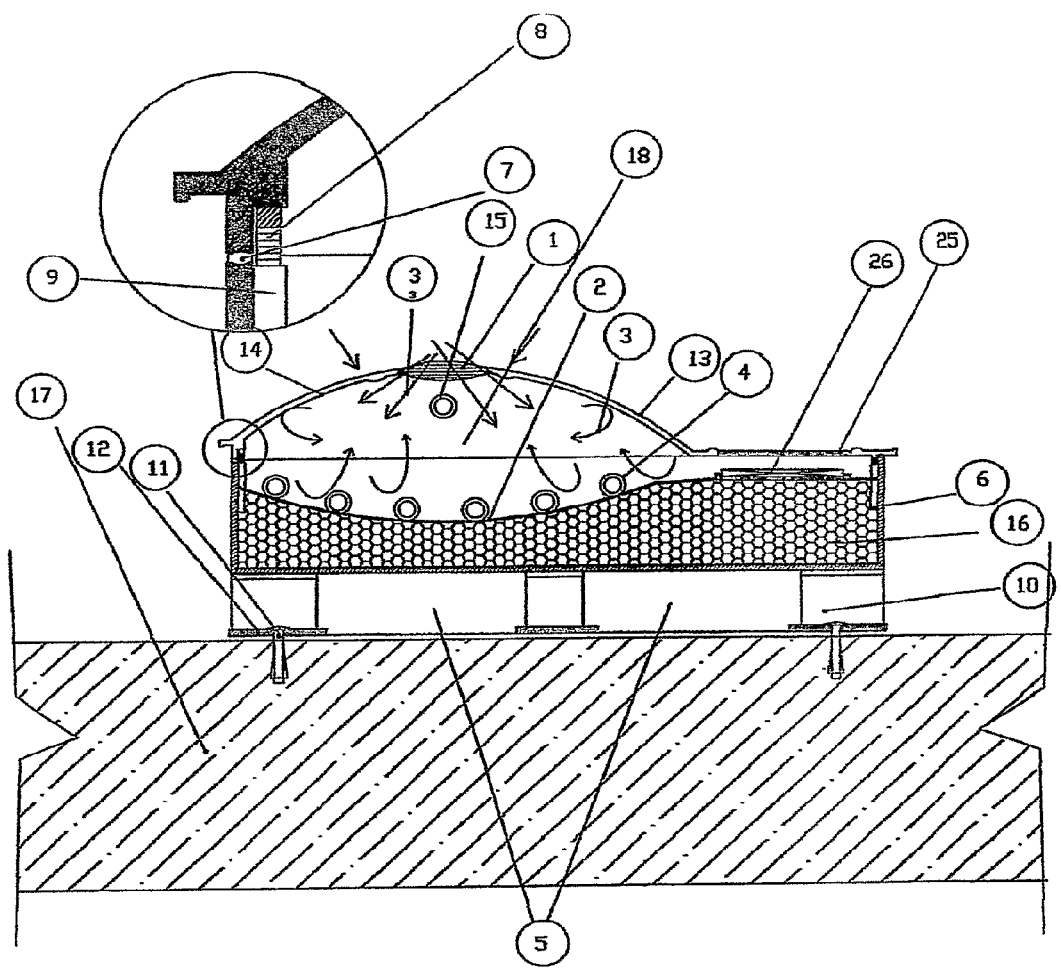
FIG. 7—Cross section of a type "A" "Tile" for the production of thermal and electrical energy with construction details, appearing outside as a traditional portuguese type tile. The upper tile is evident, together with the base, the lens, the inner "boiler" with plate and absorbing pipes and most of all the silica plates to increase electrical energy production, positioned on the lower flat part of the tile.

A variant of "A" type tile is shown in FIG. 7. It is made of a slightly more expensive system, adequate to increase electrical energy production, with the help of silica crystals positioned on specific lodgings on top of the absorbing plate (FIG. 7 n. 26), protected by the top tile. This type may be used in "Tiles" that use the top tile made of transparent glass support or plastic polycarbonate, etc., or with metal top plates (FIG. 7 n. 13-14), assembled together with vitreous or plastic parts (FIG. 7 n. 25) positioned matching the lodging of the silica crystals. These are all connected together through specific connections below the top tile, to form a single photovoltaic panel.

Components Description and Installation System

Installation of the "A" type tiles which produce thermal and electrical energy: After having levelled the surface, first a horizontal line of base supports should be positioned, from left to right as for traditional tiles, screwing on the lower structure the guides of some supports, depending on weather requirements, cutting the last tile on the right sideways with a hacksaw or similar tools, using a simple base tile until the metal structure on the side is reached. After positioning correctly and with the right vertical tilt the first row of base supports, the supports of the second adjacent line are positioned, one by one, fixing vertically the central and lateral pipes on the lower and upper tiles through the specific male/female joints, simply lifting the back support and pushing down until a "click" is heard. After the second line of base supports is attached, the first row of covering tiles is positioned, overlapping them one to the next from left to right and vertically aligning them to the lower tiles. After the top tiles are installed, the completed part of the roof can be safely walked on, continuing to install one line of base supports and one line of covering tiles until the end. In case the last tile is too long, the base support will be cut, in this case the one with pipes that will be subsequently connected with normal hydraulic joints. The pipes in the last base support and the complete or cut covering tile will be connected with insulated distribution copper pipes positioned inside of the base, they will be foamed and insulated after installation, covered with the same material used for the top tiles, and brought to and connected to the insulated boiler heating coils in order to produce hot water. The boiler should possibly be positioned close to the roof or in a specific place where it is to be connected to the heating system of the building. In the specific case of using the system in an area with intense sun exposure, the system may even produce steam.

As far as the production of electrical energy meant to be sent to an accumulator or to Hydro lines on the basis of the government aids, it should be specified that the four connection bolts to the lower base allow to connect all the top tiles facing north or irradiated sides, in order to obtain a single photovoltaic surface for the whole roof, since they are connected to the lower structure. In addition, they can create an even wider surface, connecting through bolts to plates or tiles positioned vertically or to other photovoltaic energy producing tiles.

The tiles that are applied to the walls of the buildings may be used to produce thermal and photovoltaic energy, using a normal tile, or just photovoltaic energy using a simple tile with or without internal insulation. The external surface of the top tile in this case takes the shape, size and color adequate to the architectural needs of the whole.

Installation of the Tiles that Only Absorb Ultraviolet Rays, Positioned on Pitched Roofs or on Walls Facing North, or where Thermal Connections are not Practical:

After the installation of type "A" tiles is complete in optimally irradiated positions, installation proceeds along the same lines for the simple type "B" tiles, which are only insulated, until roof covering is complete, or vertical walls which are able to use ultraviolet radiation in the absence of direct irradiation. Both the upper and the base tiles are cut, shaped and adjusted to the shape they are meant to cover.

Special Components and Possible Other Applications of the System:

In the production phase, the upper tiles, made in plastic or in metal, may contain on the inside metal wirings to allow connection of the roof to other specific panels, containing wirings connected to dispersing points, aimed at obtaining a Faraday cage for the whole building, or other.

To complete the system, special parts not shown in the picture are used. These are plastic or metal side bands, to cover the lateral cuts of tiles, the joints to the thermal and electrical distribution system, the joints with the silica crystals and the borders of the roof.

The invention claimed is:

1. A covering tile for roof and wall structures of buildings, comprising:
    an upper element comprising a convex portion having a reflecting inner surface, the upper element being coated with one or more photovoltaic panels,
    a base, provided with a reflecting plate covering a thermally insulating element, having a concave portion in correspondence with the convex portion of the upper element,
said convex portion of the upper element and said concave portion of the plate contributing in forming a cavity wherein a greenhouse effect is produced when the tile is exposed to solar radiation, a plurality of radiation absorbing pipes being positioned inside the cavity, the base being provided with lower positioning stands, so as to be capable to be supported by the stands over a structure and to form an air and ventilation chamber.

2. A covering tile according to claim 1, wherein said radiation absorbing pipes are provided with end male/female joints and sealing gaskets.

3. A covering tile according to claim 2, wherein said pipes are made by means of the reflecting plate and a second lower plate which define channels acting as said pipes, whereby said pipes are incorporated in such a double layer plate.

4. A covering tile according to claim 1, wherein the upper element is provided with either a bifocal or Fresnel lens for concentrating solar radiation within the cavity.

5. A covering tile according to claim 1, wherein the upper element is internally provided with metal wires.

6. A covering tile according to claim 1, wherein the upper element is made of metallic material, wherein the inner surface is galvanized, and/or plastic and/or carbon polymer and/or vitreous material, and/or wherein the inner surface is coated with reflecting paint, so that the upper element is transparent on an external side and opaque on the inner surface.

7. A covering tile according to claim 1, wherein said one or more photovoltaic panels comprise silicon films and/or conducting electrodes with micro/nano structural organic paint and/or suspended films of amorphous silicon, made porous through electrolytic attack.

8. A covering tile according to claim 1, wherein the thermally insulating element is inserted in or integral with the base.

9. A covering tile according to claim 8, wherein the thermally insulating element is foamed.

10. A covering tile according to claim 9, wherein the thermally insulating element is made of rigid thermohardened polyurethane or polystyrene.

11. A covering tile according to claim 1, wherein the upper element and the base are connected to each other through either plastic or metal joints.

12. A covering tile according to claim 11, wherein said joints comprise side threaded plugs or fixing pins of the upper element insertable in corresponding side guides of the base.

13. A covering tile according to claim 1, wherein the one or more photovoltaic panels is coated on top of the tile.

14. A system for covering roof and wall structures of buildings and producing thermal and photovoltaic energy, comprising a first plurality of covering tiles, wherein each covering tile comprises:
    an upper element comprising a convex portion having a reflecting inner surface, the upper element being coated with one or more photovoltaic panels, a base, provided with a reflecting plate covering a thermally insulating element, having a concave portion in correspondence with the convex portion of the upper element, said convex portion of the upper element and said concave portion of the plate contributing in forming a cavity wherein a greenhouse effect is produced when the tile is exposed to solar radiation, a plurality of radiation absorbing pipes being positioned inside the cavity, the base being provided with lower positioning stands, so as to be capable to be supported by the stands over a structure and to form an air and ventilation chamber, wherein corresponding pipes of adjacent tiles are connected to each other and to a heat exchanger or insulated boiler heating coils for the production of hot water and/or steam, wherein the photovoltaic panels of the tiles are connected together and to an accumulator or electrical distribution system, wherein the tiles are supported by the respective lower positioning stands over a structure so as to form an air and ventilation chamber.

15. A system according to claim 14, wherein a fluid having high calorific value flows into the pipes of the plurality of covering tiles.

16. A system according to claim 15, wherein said fluid is a mixture of nitrogen and liquid phosphorus.

17. A system according to claim 14, wherein it further comprises one or more second covering tiles comprising an upper element, having a convex portion, and a base, provided with a thermally insulating element, wherein the upper element is coupled to the base so as to lie on the thermally insulating element.

18. A system according to claim 17, wherein said thermally insulating element is foamed.

19. A system according to claim 18, wherein said thermally insulating element is made of rigid thermohardened polyurethane or polystyrene.

20. A system according to claim 17, wherein the upper element is coated with one or more photovoltaic panels connected to the photovoltaic panels of the first plurality of covering tile.

21. A system according to claim 14, wherein at least a subset of the covering tiles which the system comprises overlap each other.

22. A system according to claim 14, wherein the one or more photovoltaic panels is coated on top of the tile.

* * * * *